United States Patent [19]
Dorfman

[11] Patent Number: 6,080,470
[45] Date of Patent: Jun. 27, 2000

[54] HARD GRAPHITE-LIKE MATERIAL BONDED BY DIAMOND-LIKE FRAMEWORK

[76] Inventor: Benjamin F. Dorfman, 24 Marwood Pl., Stony Brook, N.Y. 11790

[21] Appl. No.: 08/666,873

[22] Filed: Jun. 17, 1996

[51] Int. Cl.$^7$ .................................................. C23C 16/50
[52] U.S. Cl. .................. 428/216; 427/249; 427/255; 427/457; 427/470; 427/212; 427/336; 427/408; 427/698
[58] Field of Search ..................... 428/408, 216, 428/212, 336, 698; 427/249, 255, 457, 470

[56] References Cited

U.S. PATENT DOCUMENTS 5,352,493 10/1994 Dorfman et al. .................. 428/408

FOREIGN PATENT DOCUMENTS 0470644 2/1992 European Pat. Off. .

OTHER PUBLICATIONS

Anonymous "Layered Amorphous Carbon".

*Primary Examiner*—Archene Turner
*Attorney, Agent, or Firm*—Amster, Rothstien & Ebenstein

[57] ABSTRACT

The present invention provides a novel class of hard nano-structured materials comprising $sp^2$ bonded graphite-like layers bonded together by $sp^3$ three-dimensional diamond-like frameworks, wherein the whole carbon structure is stabilized with at least two alloying elements: the first alloying element selected from the group consisting of O, H, N, and a combination thereof; and the second alloying element selected from the group consisting of Si, B, Zr, Ti, V, Cr, Be, Hf, Al, Nb, Ta, Mo, W, Mn, Re, Fe, Co, Ni, Mn, Re, Fe, Co, Ni and a combination thereof. Also disclosed, are methods of manufacture of the novel class of materials.

21 Claims, 7 Drawing Sheets

HARD GRAPHITE-LIKE MATERIAL BONDED BY DIAMOND-LIKE FRAMEWORK

BACKGROUND OF INVENTION

1. Field of the Invention

The present invention relates generally to a new class of hard nano-structured materials, including coatings and bulk solid thereof, and methods of their manufacture. More particularly, the present invention provides hard carbon materials comprising $sp^2$ bonded graphite-like layers bonded together by $sp^3$ three-dimensional diamond-like frameworks, wherein the whole carbon structure is stabilized with at least two alloying elements: the first alloying element selected from the group consisting of O, H, N, and a combination thereof; and the second alloying element selected from the group consisting of Si, B, Zr, Ti, V, Cr, Be, Hf, Al, Nb, Ta, Mo, W, Mn, Re, Fe, Co, Ni and a combination thereof. The graphite-like layers are mutually parallel with no azimuth order in-plane, and the diamond-like framework is fully amorphous. The ratio between graphite-like $sp^2$ bonds and diamond-like $sp^3$ bonds, and/or bonds between carbon and stabilizing elements may be gradually modulated forming a hierarchical structured material.

2. Description of the Prior Art

Structuring composite materials in micro, sub-micro, and nano scales constitutes one of the major areas of research in material engineering technology today. Such research combines different forms of carbon, including organic materials, nonorganic carbon-based materials, and diamond and/or diamond-like carbon to form composite materials exhibiting different physical properties.

Another area of research in the field of composite materials includes the hierarchical composites possessing a one-, two-, or three-dimensional artificially ordered structure. A traditional approach for hierarchical composite manufacturing is based on the combination of several known technologies to form composite components using the process of sintering to form artificial, bulk materials. However, approaches are limited by the structural resolution. At, or close to the structural resolution limits, the productivity of the composite declines, and the cost correspondingly grows. Consequently, many new technologies have recently emerged in an effort to create new and improved composite materials.

One such process which has been shown to be effective to the control nanoscale structure of the composite material is intercalation. This process comprises polymerization of the interlayer spaces of layered clay mineral, montmorillonite, followed by calcination of the folded silica sheets and organic cations, resulting in a highly ordered, mesoporous nanostructured material Fulushima, Yoshiaki, Toyota Central Res. & Development Lab Inc., Journal of Japan Society of Powder and Powder Metallurgy v. 41, No 10, 1984, p. 1189–1192, which disclosure is hereby incorporated by reference).

Intercalation, however, allows synthesis of specific structures only because this method is based on pre-manufactured crystalline materials which limits the design and manufacturing of artificial composite materials in both micro- and nano-scales. Because of this restriction, much effort recently has been employed toward the synthesis of amorphous-based composite materials by organic and/or nonorganic synthesis.

For example, polymer-derived micro-nano-structured $Si_3N_4$/SiC-composites were prepared by liquid-phase sintering or either amorphous, polymer derived Si-C-N powder or SiC coated $Si_3N_4$ powder. However, following gas pressure sintering, the composites comprised nanosized SiC inclusions embedded in microcrystalline $Si_3N_4$ grains (Greiner, Axel, Bill, Joachim, Riedel, Ralf, Max-Planck-Inst.; Proceeding of Materials Research Society, v 346, 1994, p. 611–616, Pittsburg, Pa., USA, which disclosure is hereby incorporated by reference).

U.S. Pat. No. 5,206,083 (1993) to Raj et al., hereby incorporated by reference, discloses diamond films deposited on a metal or ceramic composite comprising a matrix having dispersed therein finely divided diamond or diamond-like particles. These composites are useful in improving the erosion resistance of materials used for long wave infrared transmitting applications such as domes and infrared windows.

U.S. Pat. No. 4,948,388 (1990) to Ringwood, hereby incorporated by reference, discloses a diamond compact comprised of 60–95 volume percent of diamond crystals which have plastically deformed so that they form a rigid framework structure. The contacts between the diamond crystals occur over surfaces arising from plastic deformation of the diamond crystals during formation of the compact under pressure and temperature conditions within the graphite stability field. The diamond framework structure is bonded together by interstitial refractory carbide phases or metallic phases comprised of metal not forming carbides in the presence of carbon. The compact comprises less than about 2 percent volume of graphite and a compressive strength greater than 10 kbars.

U.S. Pat. No. 5,198,285 (1993) to Arai et al., hereby incorporated by reference, discloses a thin film of amorphous carbon-hydrogen-silicon comprising carbon and hydrogen as major components. The remaining composition comprises a silicon based material containing diamond-like carbon. The content of hydrogen is from about 30 to 50 atomic % weight. The content of carbon is about 70 atomic % weight or greater with respect to the total composition, except hydrogen and iron based metallic material. The film of amorphous carbon-hydrogen-silicon is very hard and has a small coefficient of friction.

U.S. Pat. No. 5,183,602 (1993) Raj et al., hereby incorporated by reference, discloses an improved carbon-metal composite comprising a carbon matrix and metal fibers distributed in the carbon matrix. The surfaces of at least a portion of the fibers are coated or alloyed with another material which has a tendency to form carbides which is equal or lower than that of metal constituting the metal fibers. The metal fibers are distributed in the carbon matrix in such a manner that their content varies along the thickness of composite, thereby imparting to the composite improved properties with respect to at least one of the following properties: mechanical strength, impact resistance, wear resistance, and electrical conductivity of a dispersion of small particles of diamonds in a matrix having infrared transmission properties and refractive index substantially similar to that of diamonds. The composites exhibit mechanical toughness and durability 2–4 times that of the similarly treated matrix alone without adverse effect on optical properties.

U.S. Pat. Nos. 5,352,493 (1994) to Dorfman et al., and 5,466,431 (1995) to Dorfman et al., which disclosures are hereby incorporated by reference, disclose a class of diamond-like materials formed from interpenetrating networks of carbon and alloying elements, as well as methods of fabricating such nanocomposite films. The films possess a unique combination of chemical and mechanical resistance, temperature stability, and wide range of electronic properties including low-temperature superconductivity. They may be used as protective coatings, electronic material, sensors, biocompatible materials. The method of these materials fabricating is based on co-deposition of the clusterless beams, wherein at least 50% of carbon particles comprise an energy above 100 eV, and the temperature of the substrate during the growth is less than about 500° C. Common range of the carbon particles energy is 0.3 to 5 keV, and usually is about 1 to 1.5 keV, and the substrate temperature during the growth is less than about 200° C. However, the growth rate is very limited, usually is in the range of 0.3 to 3.0 mm/h. Further, the material can be produced as a film, but its manufacturing requires a high-voltage power supply. Also, the hardness of these composite films is limited with about 20–22 GPa maximum, and usually does not exceeds about 12–15 Gpa.

Although this material is very stable against graphitization, during growth its structure is very sensitive to the particles energy and substrate temperature due to the possible graphite-like carbon forming. While Graphite is a layered substance whose structure and properties can be altered in a wide range, graphite is very fragile upon the application of mechanical stress, which is inherent to the week van der Vaals interaction between layers (Yudasaka et al., Yoshimura p-Electron Project, Japan; Appl. Phys. Lett. 64(7), 1994, which disclosure is hereby incorporated by reference). It has been recently demonstrated that interface between amorphous carbon and graphite usually creates unbonded radicals which weaken the structural rigidity of the materials, thereby providing a fracture path under stress (Yoon et al., Cambridge, Mass.; Interface Science, v. 3, 1995, p. 85–100, which disclosure is hereby incorporated by reference).

The present invention provides novel hard carbon materials which are believed to overcome the problems associated with the above described processes. The materials of the present invention comprise both, graphite-like and diamond-like carbon in a hierarchical structure, wherein the graphite-like layers are bonded together by the diamond-like framework such that the whole carbon structure is stabilized with at least two alloying elements. The materials of the present invention can be produced as coatings, as well as, bulk solid matter in a wide substrate temperature range using low voltage equipment. The growth rate of the materials of the invention can exceed 20 $\mu$m/h, and hardness is usually in the range of about 20 to 35 GPa, but can exceed 50 Gpa. Elastic modules is usually in the range of about 150 to 250 Gpa, but can exceed 500 GPa.

SUMMARY OF THE INVENTION

A primary object of the present invention is to provide a new class of solid-state, carbon materials comprising $sp^2$ bonded graphite-like layers bonded together by $sp^3$ bonded, three-dimensional diamond-like frameworks, wherein the whole carbon structure is stabilized with at least two alloying elements.

Another object of the present invention is to provide such carbon materials, wherein the components of the $sp^3$ and $sp^2$ carbon-carbon bonds, and/or carbide, silicide, and oxide bonds, can be modulated between the carbon and the stabilizing elements in nanometer scale and/or micrometer scale.

Another object of the present invention is to provide such carbon materials, wherein the nanocrystals or clusters of diamond, and/or carbides, silicides, oxides, and/or metals are embodied in the amorphous structure of said materials.

Another object of the present invention is to provide such carbon materials, wherein the layers of stabilizing elements and/or their compounds are embodied in the amorphous structure, and the thickness of said stabilizing layers is in the range of about 1 nm to 1,000 nm.

Accordingly, the present invention provides a novel class of hard carbon materials comprising $sp^2$ bonded graphite-like layers bonded together by $sp^3$ bonded three-dimensional diamond-like frameworks. The graphite-like layered structure is bonded together by the diamond-like framework such that the graphite-like layers are mutually parallel with no azimuth order in-plane, and the diamond-like framework is amorphous. The carbon structure is stabilized with at least two alloying elements. More preferably, the carbon structure is stabilized with two alloying elements designated a first alloying element and a second alloying element. The first alloying element comprises an element selected from the group consisting of O, H, N and a combination thereof The second alloying element comprises an element selected from the group consisting of Si, B, Zr, Ti, V, Cr, Be, Hf, Al, Nb, Ta, Mo, W, Mn, Re, Fe, Co, Ni and a combination thereof.

The carbon content in the material of the invention comprises from about 40 to about 90 atomic % of the sum of carbon plus the total alloying elements. The $sp^2$ carbon-carbon bond content in the material of the invention comprises from about 15 to about 90 atomic % of the sum of carbon-carbon bonds in said material The diamond-like $sp^3$ carbon-carbon bond content in the material of the invention comprises from about 15 to about 90 atomic % of the sum of carbon-carbon bonds. The sum of concentration of the total alloying elements in the material of the invention comprises from about 10 to about 60 atomic weight % of the sum of carbon plus the total alloying elements.

The novel class of carbon materials of the present invention exhibit high mechanical properties (hardness, fatigue, specific modulus, tribological characteristics, etc.), low specific weight, variable electrical properties, thermal stability, corrosion resistance, wear resistance, high adhesion to virtually any substrate. The materials of the invention can be deposited upon metals, ceramics, composites, glasses, and plastics, including Teflon®. The materials of the invention can be used as protective coatings for various applications, for aerospace and automotive industries, for electronics and as an orthopedic material.

Also disclosed are methods of fabricating the novel carbon materials of the present invention. The methods of the invention comprise vacuum plasma technology combined with electrical-magnetic energizing of the incident particles, and thermal activation of the surface growth. The methods of fabrication can also comprise a high speed rotating substrate holder and multiple plasmatrons.

BRIEF DESCRIPTION OF THE DRAWINGS

The main features of the invention will become apparent upon examination of the accompanying drawings wherein.

DETAILED DESCRIPTION OF THE INVENTION

The present invention provides a novel class of hard carbon materials comprising $sp^2$ bonded graphite-like layers bonded together by $sp^3$ bonded three-dimensional diamond-like frameworks. The graphite-like layered structure is bonded together by the diamond-like framework such that the graphite-like layers are mutually parallel with no azimuth order in-plane, and the diamond-like framework is amorphous. The carbon structure is stabilized with at least two alloying elements. More preferably, the carbon structure is stabilized with two alloying elements designated a first alloying element and a second alloying element. The first alloying element comprises an element selected from the group consisting of O, H, N and a combination thereof The second alloying element comprises an element selected from the group consisting of Si, B, Zr, Ti, V, Cr, Be, Hf, Al, Nb, Ta, Mo, W, Mn, Re, Fe, Co, Ni and a combination thereof The graphite-like layered structure is bonded together by the diamond-like framework such that the graphite-like layers are mutually parallel with no azimuth order in-plane, and the diamond-like framework is amorphous.

As used herein, the term "graphite-like bonding" refers to the $sp^2$ carbon-carbon bondings. The term "graphite-like layered or layers" refers to the carbon-based layers wherein the graphite-like bondings are oriented predominantly in a plane. The term "graphite-like material" refers to a material comprising graphite-like layers. The term "diamond-like bondings" refers to the $sp^3$ carbon-carbon bondings. The term "diamond-like framework" refers to a three-dimensional, predominantly $sp^3$ carbon network chemically bonded with graphite-like layers which penetrate through the whole structure of the carbon material. The term "Quasam" is a "coined" term referring to the hard carbon material (s) of the invention and is interchangeable with "carbon material(s) and/or material(s)". The term "alloying elements" refers to any element of the Periodic Table, excluding carbon and hydrogen. The term effective bias potential refers to the accelerating potential of the substrate relative to the plasma discharge.

Figure 1:
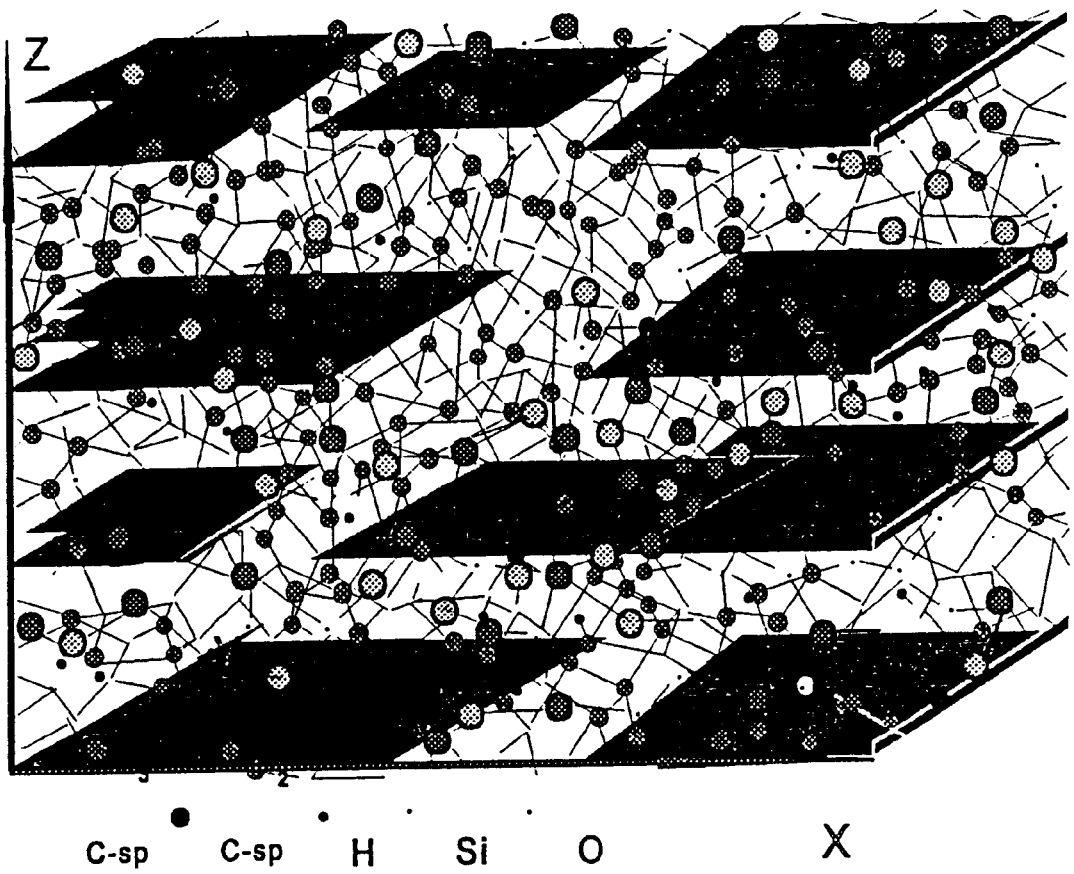
FIG. 1 is a schematic diagram showing an embodiment of the carbon material of the invention.

In one embodiment of the invention, as shown in FIG. 1, the carbon materials comprise a layered arrangement whereby there is no order in-plane in the graphite-like layers or in the diamond-like framework of the materials. The carbon material of the invention combines the features of both ordered and amorphous solid matters and thus can be designated as "Quasi-amorphous." The carbon concentration in the material of the invention comprises from about 40 to about 90 atomic % of the sum of the concentration of carbon plus the total alloying elements. The concentration of $sp^2$ carbon-carbon bondings in the material comprises from about 15 to about 90 atomic % of the sum of the carbon-carbon bonds in the material. The concentration of $sp^3$ carbon-carbon bondings in the material comprises from about 15 to about 90 atomic % of the sum of carbon-carbon bonds in the material. The sum of concentration of the alloying elements in the material is form about 10 to about 60 atomic % of the sum of carbon plus the alloying elements.

In a more preferred embodiment of the invention, the concentration of $sp^2$ carbon-carbon bondings in the material comprises from about 20 to about 80 atomic % of the sum of the carbon-carbon bonds in the material, the concentration of $sp^3$ carbon-carbon bondings in the material comprises from about 20 to about 80 atomic % of the sum of carbon-carbon bonds in the material, the carbon concentration in the material of the invention comprises from about 40 to about 90 atomic % of the sum of the concentration of carbon plus the total alloying elements, and the sum of concentration of the alloying elements in the material is from about 10 to about 60 atomic % of the sum of carbon plus the alloying elements.

In still a more preferred embodiment of the invention, the concentration of $sp^2$ carbon-carbon bondings in the material comprises from about 30 to about 55 atomic % of the sum of the carbon-carbon bonds in the material, the concentration of $sp^3$ carbon-carbon bondings in the material comprises from about 45 to about 70 atomic % of the sum of carbon-carbon bonds in the material, the carbon concentration in the material of the invention comprises from about 55 to about 80 atomic % of the sum of the concentration of carbon plus the total alloying elements, and the sum of concentration of the alloying elements in the material is from about 20 to about 45 atomic % of the sum of carbon plus the alloying elements.

Preferably, the carbon concentration in the material of the invention comprises at least 40 atomic % of the sum of the concentration of carbon plus the total alloying elements, and the $sp^2$ carbon-carbon bondings in the material comprises at least 15 atomic % for optimal structure formation.

Figure 2:
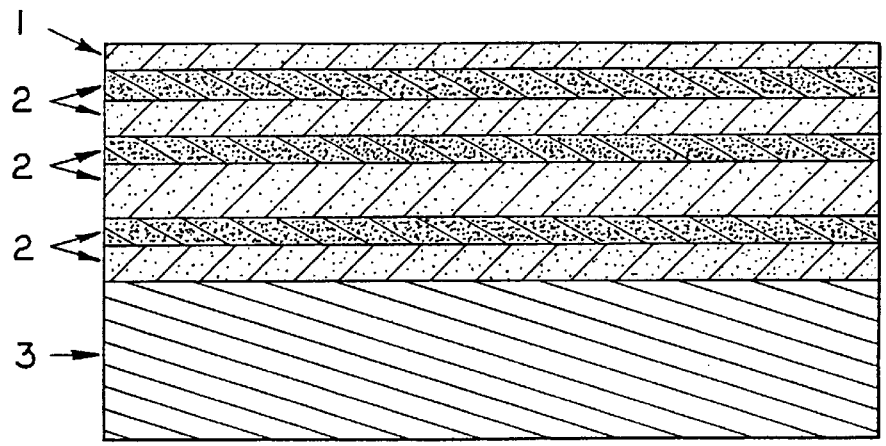
FIG. 2 is a schematic diagram showing an embodiment of a hierarchically structure of the carbon material of the invention, wherein the ratio between graphite-like $sp^2$ bonds and diamond-like $sp^3$ bonds is periodically modulated [Period of modulation is in the range of 10 nm to 1000 nm; (1)—soft upper layer, self lubricant, (2)—structure with periods of modulation, (3)—substrate].

In accordance with the present invention, it is possible to synthesize a hierarchical structured material by gradually varying and/or modulating the ratio between the graphite-like $sp^2$ carbon-carbon bonds and the diamond-like $sp^3$ carbon-carbon bonds in a nanometer and/or micrometer scale, as shown in FIG. 2. The resultant structure possesses properties of increased flexibility and fracture strength, while exhibiting a decrease in intrinsic stress. Preferably, the ratio between the graphite-like $sp^2$ carbon-carbon bonds and the diamond-like $sp^3$ carbon-carbon bonds are periodically varied and/or modulated in the range of from about 10 nm to about 100 mm. It is also possible in accordance with the invention to synthesize the hierarchical material structure wherein the contents of the $sp^3$ and $sp^2$ carbon-carbon bonds, and/or carbide, silicide, and oxide bonds, between the carbon and alloying elements are gradually varied and/or modulated in nanometer and/or micrometer scale.

In another embodiment of the invention, the concentration of graphite-like $sp^2$ carbon-carbon bonds preferably is greater than about 15 atomic % of the sum of carbon-carbon bonds in the material, the concentration of diamond-like $sp^3$ carbon-carbon bonds is greater than about 15 atomic % of the sum of carbon-carbon bonds in the material, and the sum of concentration of alloying elements in the material is greater than about 10 atomic % of the sum of carbon plus the total alloying elements.

The alloying elements in the material of the invention provide stabilization to the material. That is, given the basic thermodynamic properties of the solid carbon phases, any combination of graphite-like and diamond-like carbon in one solid matter is usually unstable and typically results in transition of the matter to a common, graphite structure. The alloying elements in the material, however, prevent the diamond-graphite transition and allow use of the material of the invention under a wide range of temperature, mechanical stress and environmental conditions.

The stabilizing alloying element can comprise Si, B, Cr, Be, Al or any element selected from the hard-melting transition metals. More preferably, the alloying element is a complex alloying element comprising at least two alloying elements. The first alloying element comprises an element selected from the group O, H, N, and a combination thereof. The second alloying element comprises an element selected from the group comprising Si, B, Zr, Ti, V, Cr, Be, Mg, Ca, Hf, Nb, Ta, Mo, W and a combination thereof Alternatively, the alloying element can comprise a combination of elements selected from the first alloying element group used together with a combination of elements selected from the second alloying element group.

The sum of concentration of the alloying elements in the material comprises from about 10 to about 60 atomic % of the sum of carbon plus the total alloying elements. Preferably, the sum of concentration of the alloying elements comprises from about 20 to 45 atomic % of the sum of carbon plus alloying elements. Typically, if the sum of concentration of the alloying element falls below 10 atomic % the stabilizing effect is too weak, while above 60 atomic %, formation of the carbon material structure of the invention is poor.

The most preferred combination of alloying elements comprises silicon and oxygen. This combination has been found to provide a very stable non-stoichiometric amorphous silica network $SiO_x$. The stable amorphous silica $SiO_x$ network prevents growth of the graphite microcrystals, and therefore optimizes stabilization of the carbon material structure. An advantage of using silicon (Si) and oxygen ($O_x$) as the alloying elements, is that both of these elements are equally effective to bond the free valence electrons of both graphite-like and diamond-like carbon. Thus, the thermal stability of the carbon material structure is increased. This, in turn, improves the mechanical properties of the material while decreasing it intrinsic stress.

While the Si-C bondings provide stronger cohesion between the graphite-like layers and the diamond-like carbon framework, and the amorphous silica network, result in a material exhibiting superior hardness and a wide electronic and optical gap, it has been determined that using Si-O-C bonds between the carbon structures and silica networks provides the material structure with a higher flexibility. Based upon the precursors type, concentration selection, and growth conditions, a wide range of Si-C to Si-O-C bonding ratios can be used in the materials of the invention. For example, the bonding ratio can vary from equal concentrations of Si-C and Si-O-C bondings to predominantly Si-O-C bondings. Also, the ratio between Si-O and C-O bondings can be varied and, preferably is in the range of (Si-O):(C-O)>10:1. By varying the bonding ratios, it is possible to vary the mechanical properties of the material.

Another important feature of the material of the invention is that the $SiO_x$ network can easily form chemical bonds with virtually any substrate, and hence exhibits high adhesion to virtually any substrate without requiring a special interlayer. In addition, the elements, carbon, silicon, and oxygen possess low specific weight, are inexpensive, and do not produce any harmful emission during synthesis or use.

The sum of silicon and oxygen content in non-stoichiometric amorphous silica network $SiO_x$ is preferably in the range of from about 10 to about 60 atomic % of the sum of concentration of carbon plus the alloying elements, and more preferably in the range of from about 15 to about 45 atomic % of the sum of concentration of carbon plus alloying elements. Most preferably, the sum of silicon and oxygen content is in the range of from about 15 to about atomic % of the sum of concentration of carbon plus alloying elements. The oxygen concentration "x" in the non-stoichiometric amorphous silica network, $SiO_x$, preferably is in the range of from about 0.5 to about 2.0, and more preferably in the range of from about 0.5 to about 1.5, and most preferably, in the range of from about 0.5 to about 0.9. Such a non-stoichiometric ranges provide the most favorable conditions for the amorphous stabilizing network formation during Quasam synthesis. In addition, such ranges provide the best condition for the mutual saturation of free carbon and stabilizing element bonding.

In a preferred embodiment, the concentration of silicon in the material is in the range of from about 10 to about 20 atomic % of the sum of concentration of carbon plus alloying elements, the concentration of oxygen is in the range of 5 to 15 atomic % of the sum of concentration of carbon plus alloying elements; while the total sum of silicon and oxygen is in the range of about 15 to about 30 atomic % of the sum of concentration of carbon plus alloying elements. Alternative alloying element combinations comprise $TiO_x$, $ZrO_x$, $HfO_x$, $Bn_x$, $TiN_x$, $ZrN_x$, $HiN_x$. The nitrogen content "x" preferably is in the range of from about 0.5 to about 1.0.

The carbon material optionally can comprise hydrogen in the structure. Hydrogen also saturates the free carbon bondings and facilitates stabilization of the structure thereby providing the material with additional flexibility. However, hydrogen can decrease the thermal stability and hardness of Quasam. Hydrogen can also cause gas emission which is not particularly favorable in high vacuum applications of the material. The maximum concentration of hydrogen is preferably about 100 atomic % of the carbon concentration and, more preferably, the hydrogen concentration is less than about 50 atomic % of the carbon concentration. Most preferably, the concentration of hydrogen is less than 15 atomic % of the carbon concentration. It is understood that the material of the invention can comprise three-component, four-component, as well as more complicated combinations of the alloying elements, depending on the specific technical requirements required of the material. The alloying combination $SiO_x(Fe,Ni,Cr)_y$, wherein the ranges of x and y comprise $0.5 \leq x 1.0$ and $1 \leq y \leq 3$ can provide Quasam having properties of electrical conductivity and resistance against high temperature oxidation, while maintaining its magnetic and catalytic properties. In order to characterize the material of the invention, because the material is neither crystalline nor pure amorphous solid matter, no one method alone can be used for structure characterization. It is necessary to utilize a group of methods for identifying such characteristics. Such methods can be selected from the any know method for characterization of the requisite property. For example, such methods include Auger spectroscopy, XAFS (X-Ray Absorption Fine Structure), XPS (X-Ray Photoelectron Spectroscopy), Raman Spectroscopy, etc. High-Resolution X-Diffraction based on the synchrotron light source does not expose any long-range order that corresponds to an absolutely pure amorphous solid matter, even in the very thick, free-standing Quasam specimens. However, at the same time, High-Resolution X-Diffraction reveals a strong evidence of short-range order due to the graphite-like layered structure. The chemical structure of the material studied by NEXAFS (Near-Edge x-Ray Absorption Fine Structure), XPS and also by Infra-Red Spectroscopy may or may not reveal evidence of carbide bondings between the carbon structure and the alloying elements. Carbide bondings depends on the material synthesis conditions and can be controlled during growth, as described hereinafter. However NEXAFS and XPS indicate an evidence of C-O-Si and C-O-Me bondings between the carbon-based structure and the alloying element. Also XAFS reveals an unusual shift of oxygen peak that apart of Quasam is observed only in high-temperature superconductors that are also highly anisotropic and intrinsically disordered layered materials. XPS reveals a similar behavior of the characteristic oxygen features in Quasam. Mechanical testing revealed a layered structure of the material.

Figure 3A:
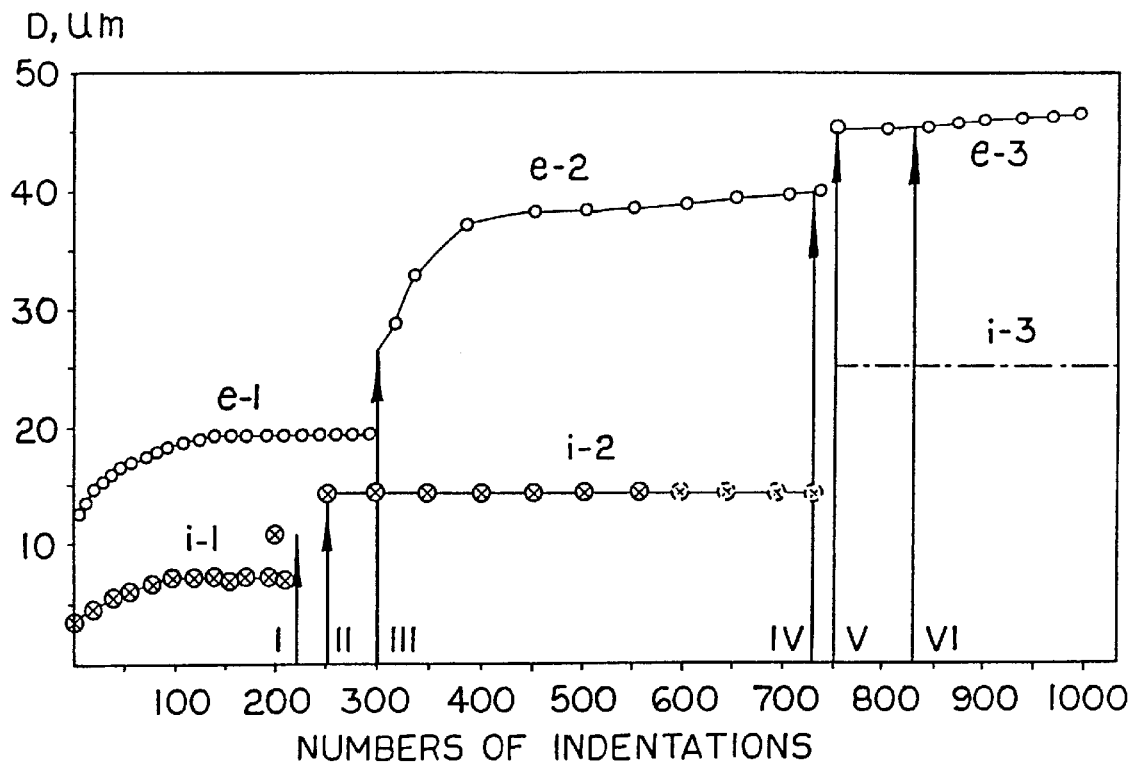
FIG. 3(a) & (b) is a graph showing results obtained using 1000 indentations of diamond pyramid (by Vickers) in the same point using an embodiment of the carbon material of the invention [Top figure: 1.15N load, 50 µm thick sample; Bottom figure: 0.65N load, 205 µm thick sample].
Figure 3B:
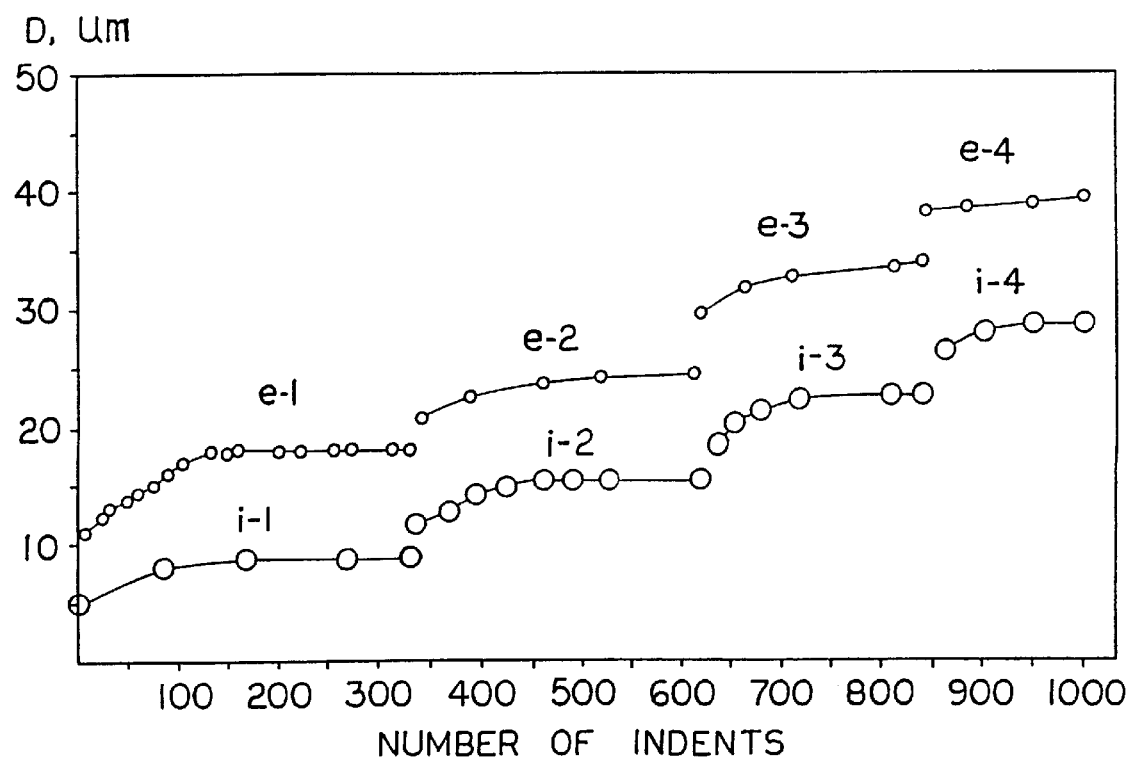

With reference to FIG. 3A and 3B, there is shown results obtained using 1000 indentations of diamond pyramid (by Vickers) with 115N load in the same point of a 50 mm thick Quasam sample. The curves represent the plots of the Imprint Diagonal vs. Number of imprints. Curves "i" shows the imprinted area, while curves "e" are plots of the maximum contact area (including both, plastic and elastic deformation). Critical points of the tests are indicated with numbers: I=2.5 hours relaxation; II=8 mm internal crack; III–V=shallow splits. Maximum final indented depth was about 10 $\mu$m, e.g. 20% of the material thickness. One of the important features exposed during these and other mechanical tests of Quasam is a strong stratified character of the Quasam fracture, as is demonstrated in the figures. In the material tested in FIGS. 3A and 3B, after the first 250 indentations a shallow 8 mm long crack was observed. However no crack propagation was forced thereafter. After 300 indentations a micro-splitting was observed and a fresh stratum was exposed. Only after 730 indentations was a new shallow crack initiated. After the 750 indentations in sum, a new micro-splitting took place. A new stratum was exposed, which withheld without any new crack up to the $1000^{th}$ indentation when tests were finished. Such behavior is typical for the Quasam. Thus, the present invention provides a new class of materials exhibiting extremely high fracture toughness similar to that of high quality steel. With reference to Table 1, there is shown the hardness and fracture toughness of Quasam along with other materials for purposes of illustration of the superior features of the present material.

TABLE 1

| Material | Modules MPa | Hardness MPa | Fracture Toughness MPa √m |
|---|---|---|---|
| Quasam | | | |
| minimum | 120 | 12 | 40 |
| typical | 200 | 25 | 45 |
| maximum | 550 | 60 | 55 |
| Ultrahigh-strength steels | 200–220 | about 1.0 | 20 to 120 |
| Soda-lime glass | 70 | 5.5 | 0.70 |
| Fused Quartz | 72 | 8.9 | 0.58 |
| Silicon | 168 | 9.3 | 0.70 |
| Sapphire | 403 | 21.6 | 2.2 |
| $Si_3N_4$ | 300 | 16.3 | 4.0 |
| Diamond films | about 1000 | about 100 | 2.2 |

The cracking threshold of Quasam is correspondingly high. For a Vickers indenter, the cracking threshold of Quasam typically exceeds 2N, and in some samples has been shown to exceed 4N. Also, less than 2% of the 2000 tests exposed cracks under loads 0.65N. In contrast, in most ceramics cracking thresholds typically are about 0.25N. It has been determined that the stratified fracture and novel mechanical properties of Quasam are due to the fundamental structure of this new class of materials which integrates features of both carbon solid forms, graphite and diamond. Illustrative novel properties of Quasam include, without limitation, diamond-like hardness and graphite-like stratification. Furthermore, while diamond is a brittle material with high, three dimensional mechanical strength, the diamond fracture toughness is relatively low. Also, graphite possesses even higher than diamond strength in plane, however, theoretical strength cannot be exposed in bulk graphite due to a very weak interaction between the layers of graphite structure. In contrast, the graphite layers in Quasam are bonded by a diamond-like framework and possess a hardness of up to about 55–60 Gpa which corresponds to the crystalline diamond hardness in relatively soft <100>direction. Yet, the fracture toughness of Quasam much exceeds the diamond value and thus cannot be compared to common graphite.

Quasam exhibits a strong cleavage fracture, and yields the atomically smooth straits. However, opposite to graphite, the fracture of Quasam occurs with very high loads and never expends in an area over a few microns width or depth. As a result, the fractured specimen does not experience a destructive damage apart from a shallow trace of indent or scratching at the tip of the material.

Quasam's fundamental structure comprises isotropic mechanical properties in planes while it may be slightly one-axis anisotropic with a special axis along the growth direction (i.e., the Vickers hardness values measured by indentation of two perpendicular cross-fractures of a typical Quasam sample were virtually identical: 25±1 GPa, the hardness measured by indentation of the growth plane was about 30 Gpa).

Another novel feature of Quasam is that it exhibits a low density in the range of from about 1.35 to about 2.0 g.cm$^{-3}$ and, preferably, in the range of from about 1.5 to about 1.7 g.cm$^{-3}$. This is much lower than graphite density (i.e., 2.25 g.cm$^{-3}$). In comparison, the density of Diamond-Like Atomic-Scale Nanocomposite (DLN) disclosed in U.S. Pat. Nos. 5,352,493 and 5,466,431 to Dorfman et al., is in the range of from about 1.9 to about 2.5 g.cm$^{-3}$ (the Vickers hardness of DLN is in the range of from about 8 to about 22, and typically in the range of from about 10 to about 12); and Diamond-Like Carbon (DLC) is in the range of from about 1.8 to about 2.9, although the lower value correspond to a relatively soft material. Also, DLC hardness is directly proportional to its density and intrinsic stress.

In contrast, Quasam exhibits a density unlike the density of any known hard material. The lowest density hard material believed known is cubic boron nitride (c-BN) which comprises a specific density of 2.25 g.cm$^{-3}$. Silicon carbide (SiC) comprises a specific density of 3.35 g.cm$^{-3}$. The low limit of the Quasam density (1.35 g.cm$^{-3}$) corresponds to the density of common coal and to the anthracite density (1.5 to 1.7 g.cm$^{-3}$). However, such materials (coal), unlike Quasam, are very soft material. Consequently Quasam is believed to represent a novel carbon-based solid matter, as well as a new class of the hard materials.

The thermal expansion coefficient of Quasam is in the range of $1.6 \cdot 10^{-6}$ K$^{-1}$ to $1.7 \cdot 10^{-6}$ K$^{-1}$. This is close to diamond and graphite thermal expansion "in plane" (about $1.5 \cdot 10^{-6}$, K$^{-1}$), while in the perpendicular direction the graphite thermal expansion is over one order of magnitude higher ($28.10^{-6}$ $K^{-1}$). What one must take into consideration is that the thermal expansion of Quasam is not dependent on temperature up to 700° K., while the thermal expansion of diamond and graphite is strongly dependent on temperature.

Another important feature of the graphite-like layered structure of Quasam is the smoothness of this new material which is typical for the graphite cleavage planes. Table 2 shows the material surface roughness in the range of thickness varied over 4 orders of magnitude, from 0.005 $\mu$m to 160 $\mu$m and areas of measurements varied almost in 11 orders of magnitude, from 0.1 $\mu m^2$ to 75 $cm^2$, e.g. in nano ($Ra_n$), micro ($Ra\mu$), and macro (Ra) scales. The measurements were realized by Atomic Force Microscopy in the areas of measurements 0.1, 1. 0, 100, and 2500 $\mu m^2$ and by Micro-profilometry in the areas of measurements 10 $mm^2$ and in the whole substrate range (75 $cm^2$). It is demonstrated by the $Ra_n$ parameter measurements, in the micro-scale areas an atomic-scale smoothness is preserved at least up to 50 $\mu$m thickness. Such a result is in conformity with the fundamental structure of this new class of materials, as shown in FIG. 1. At the thickness over 100 $\mu$m the $Ra_n$ parameter slowly increases but still in nano-scale range. This increase is mainly because of the micro-droplets from the plasma and microparticles from the ceramic head. Future improvements of the present technology can expand the atomic-scale smoothness over wide range of new materials thickness.

TABLE 2

The Quasam surface roughness in nano ($Ra_n$), micro ($Ra\mu$), and macro (Ra) scales

| Film thickness | $Ra_n$ (nm) in areas: | | | | $Ra\mu$ ($\mu$m) in areas: | | Ra ($\mu$m) in areas: | |
|---|---|---|---|---|---|---|---|---|
| | 0.1 $\mu m^2$ | 1.0 $\mu m^2$ | 100 $\mu m^2$ | 2500 $\mu m^2$ | 10 $mm^2$ | 75 $cm^2$ | | |
| 0.005 $\mu$m | <0.2 nm | <0.2 nm | ≦0.2 nm | ≦0.2 nm | <0.02 $\mu$m | <0.02 $\mu$m | | |
| 0.05 $\mu$m | <0.2 | <0.2 | ≦0.2 | ≦0.2 | <0.02 | <0.02 | | |
| 0.5 $\mu$m | <0.2 | <0.2 | ≦0.2 | ≦0.2 | <0.02 | <0.02 | | |
| 1.0 $\mu$m | <0.2 | <0.2 | ≦0.2 | ≦0.2 | <0.02 | <0.02 | | |
| 5.0 $\mu$m | <0.2 | 0.20 | 6 | 10 | 0.02 | 0.03 | | |
| 20 $\mu$m | ≦0.2 | ≦0.2 | <1.0 | 20 | 0.1 | 0.1 | | |
| 50 $\mu$m | ≦0.2 | ≦0.4 | 1.5 | 25 | 0.07 | 0.1 | | |
| 160 $\mu$m | 1.25 | 2.4 | 73 | 165 | 1.1 | 1.5 | | |

Figure 4:
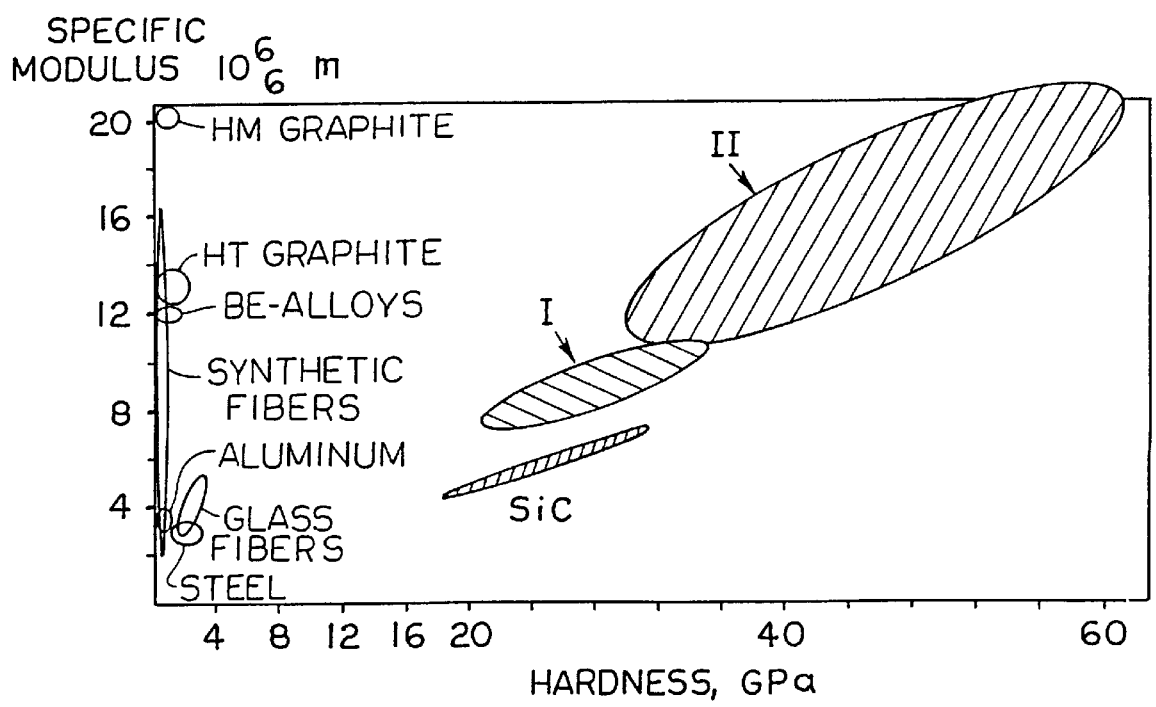
FIG. 4 is a graph showing comparative mechanical parameters of Quasam material of the invention with other known materials.

The specific density of Quasam containing a high concentration of the alloying metals, particularly heavy metals like W, can increase up to about 3 to about 6 $g.cm^{-3}$. However, the higher values corresponds to specific applications of these materials which usually are not essential to the specific weight (e.g. protective coatings, supported catalyst, etc.). The dielectric Quasam materials typically comprise a specific weight below 2.0 $g.cm^{-3}$ and electric conductive material of about 2.5–3.5 $g.cm^{-3}$. Such a low density, in conjunction with elastic modules of 100 to over 500 GPa, provides the new class of materials of the invention having high specific values for some mechanical parameters, as shown in FIG. 4, According to the present invention, it is possible to synthesize the materials wherein the nanocrystals or clusters of diamond, and/or carbides, silicides, oxides, and/or metals are embodied in the predominantly amorphous layer(s) and/or structure. Such materials have mechanical application in fields requiring high abrasion resistance, as well as electronic and photo-electronic applications where the nanocrystals can be used as the electronic microdevice.

Also in accordance with the present invention, it is possible to synthesize the materials wherein the layers of stabilizing elements and/or their compounds are embodied in the predominantly amorphous structure. The thickness of the embodied stabilizing layers is in the range of from about 1 nm to about 1,000 nm. Such a structure provides stabilization to the Quasam during the synthesis process. Also, such a structure comprising dielectric matrix layers and thin metallic layers has application for multi-level electronic packaging.

The material (Quasam) can be fabricated in the form of very thin films (i.e., 1.0 nm in thickness) to bulk material (i.e., 1.0 inch thick layered composite materials). While the present technology allows for a material deposition area over 0.7 $m^2$, no limit appears to exist for the deposition area or the thickness of the deposited material such that it is possible to develop a very light material that can be used in the aerospace industry, such as for aircraft.

Figure 5:
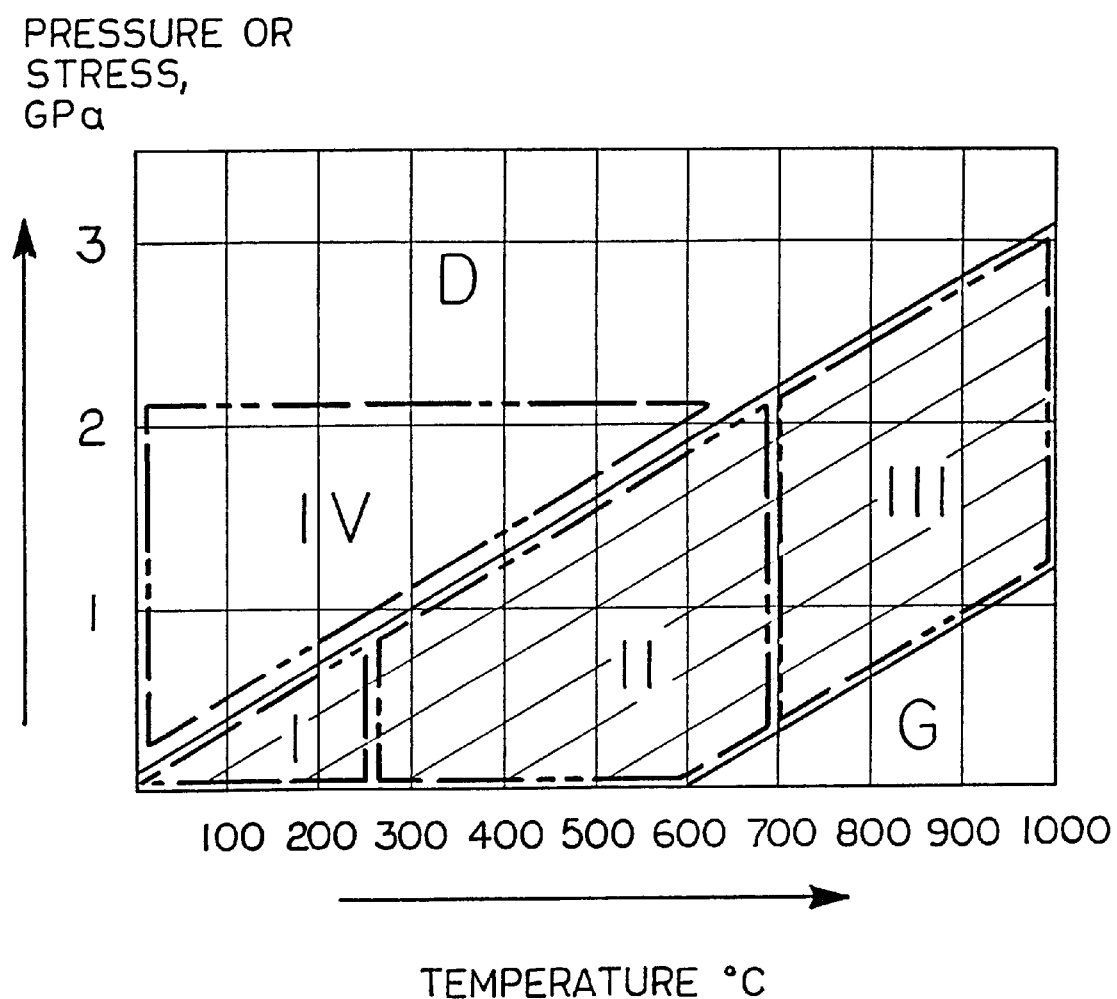
FIG. 5 is a graph showing the approximate range of the carbon phase equilibrium in Quasam (top) and common Diamond-Like Carbon (bottom) in the coordinates Temperature-Stress [Compressive stress is equal to pressure].

The principles of the present technology are based on a shift of the carbon phase equilibrium using alloying elements, as shown in FIG. 5, and on a combination of electrical-magnetic energizing and thermal activation of the precursor species during material synthesis. This process (i.e., thermal activation of the surface growth; and activation by kinetic energy of the incident particles), creates quasi-equilibrium growth conditions whereby the material formed comprises a structure having an optimum $sp^2:sp^3$ ratio. In this structure, almost all the $sp^2$ bondings are oriented in the growth plane only, while the $sp^3$ bondings form a three-dimensional network. This because of the principle distinction between the nucleation mechanism of the graphite-like matter and diamond-like matter. The graphite layers formation is promoted by a stabilizing surface, where the tetrahedral diamond-like network formation is activated by kinetic energy of the incident particles and by the point-like centers of nucleation upon the growth surface and, particularly, by free bondings of the formed $sp^3$ network.

During formation of the materials, the carbon and alloying elements valence bonds can initially remain free in the growing structure. In this regard, it is important that at the optimum deposition temperature, that moderate thermal activation promote the mutual saturation of such free bonds (i.e., C-O, Si-O, C-Si, etc.), while these atoms occupy positions upon the surface, or few top surface, layers. In any event, during this period in the process, each carbon (or alloying atom) can form bonding with other atoms without essential deformation of the solid material. Also, such saturation does not create any additional stress in the material structure.

Furthermore, if the temperature during synthesis is too low, too many free bonds are freezing in the growing structure and the resultant material is not stable due to high stress. If the temperature during synthesis is too high, the graphite-like structure transforms into micro-crystalline graphite. If the incident particles energy is too low, the concentration of $sp^3$ bondings decrease and the material may not be formed. If the incident particles energy is too high, accidental orientation of $sp^2$ and $sp^3$ bondings occurs, and the material may not form.

At optimum growth conditions, a hybrid carbon based structure is formed comprising two solid matters, diamond and graphite, in a single material, thereby providing the material of the invention with novel properties. The technology of the invention can be described as formation of thermodynamically stable graphite layers using thermally activated processes, while simultaneous "sewing" these layers together with diamond-like filaments of atomic scale. Optimum growth conditions comprise (1) electrical-magnetic energizing of the initial gas species; (2) surface thermal activation at a particular temperature range; and (3) shifting the carbon phase equilibrium using alloying elements in order to support the continuous quasi-equilibrium growth conditions which are necessary for synthesis of the material of the invention. Important parameters to control during material synthesis include the type and energy of the incident ions and charged radicals upon the growing material surface and the temperature of the material during its growth.

Figure 6:
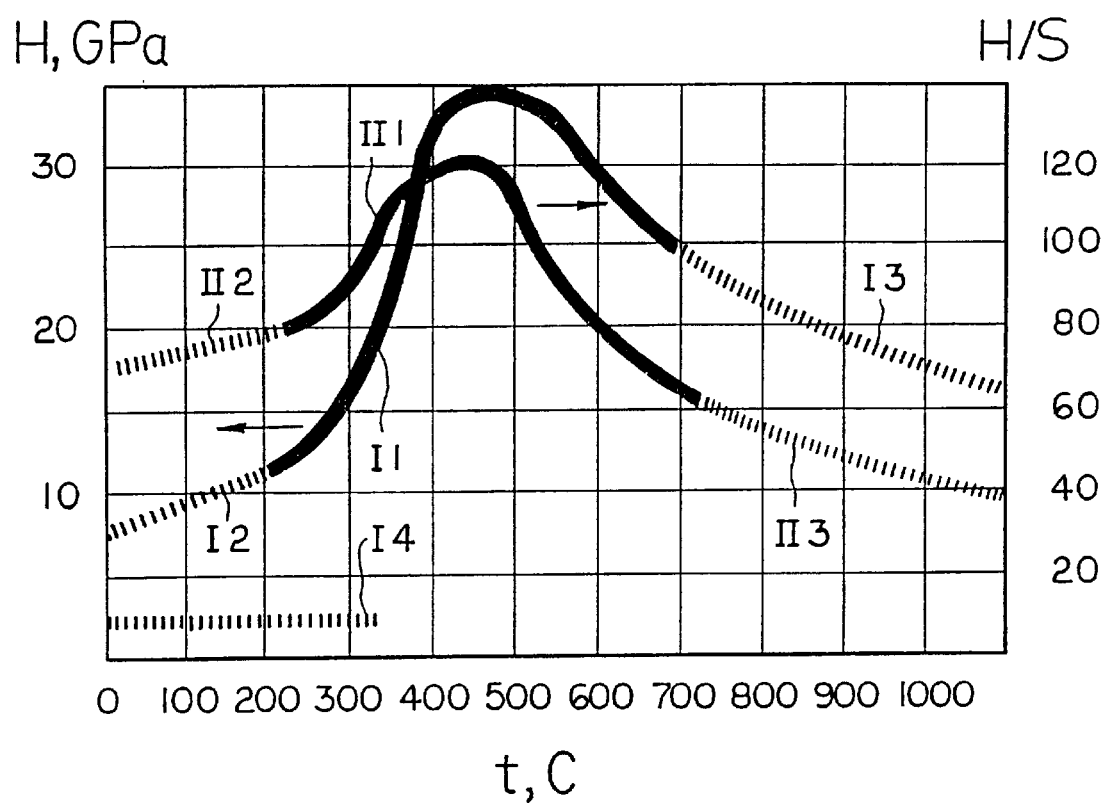
FIG. 6 is a graph showing the correlation between properties and growth conditions of the material of the invention [Hardness and hardness/stress ratio v. growth temperature].

The range of the incident particles energy during Quasam growth is preferably from about 10 to about 500 eV, more preferably from about 25 to about 250 eV and most preferably from about 50 to about 200 eV. In the above range of energy, the incident ions and charged radicals form the necessary bondings to impart the material of the invention with novel features such as high mechanical properties (i.e., hardness, elastic modules, fracture toughness) between known materials having a specific gravity below 2 g./cm$^3$, very low thermal expansion, high chemical resistance, high thermal stability and pore free structure. The range of the growth temperature during Quasam growth is preferably from about 200° C. to about 1000° C., more preferably from about 250° C. to about 650° C. and most preferably, from about 300° C. to about 500° C. As shown in FIG. 6, in this temperature range, both material hardness, and the ratio between hardness and intrinsic stress are high.

In a preferred embodiment of the growth process of the invention, the particles energy range comprises from about 50 to about 200 eV and growth temperature ranges from about 300° C. to about 500° C. The materials formed in accordance with these parameters comprise high hardness and elastic modules, in combination with the lowest specific density, intrinsic stress, and thermal expansion coefficient. Although the synthesized material is neither an equilibrium solid matter nor an equilibrium chemical compound, the material comprises a very high stability (i.e., close to crystalline diamond). Like crystalline diamond, the material of the invention is thermodynamically unstable at common conditions, but possesses an extremely high actual stability.

The preferred method of synthesis of the material of the invention comprises: (1) generating an initial plasma discharge in low pressure vapor or gas of selected precursors; the initial plasma generation is realized in a D.C. or r.f. electrical field and with applying the magnetic field in the cross direction to the electrical field; (2) applying a secondary D.C. or r.f. electrical field cross-directed to the primary electrical field and parallel to the magnetic field thereby additionally activating the initial plasma; (3) field acceleration (and direction) of the ion and charged radicals from plasma to the material deposition surface; and (4) thermally activating certain surface chemical processes on the growth front of the depositing material.

Optimizing the geometry of the plasma generator, which facilitates, as well as holds, material growth is also important. The optimum energy range of the incident particles (e.g., range of effective bias potential of the substrate during Quasam growth) preferably is about −20 to about −200 V, more preferably the range is between about −25 to about −100 V and most preferably the range is from about −50 to about −100 V. The low energy range is an important feature of the synthesis of the material of the invention because it provides a process which is simpler and necessary equipment is less expensive. The optimum range for the bias potential for synthesis of the materials of the invention is dependent on the following conditions: real pressure and its space distribution in the reactor, the reactor geometry, selected precursor, plasma generation conditions and effectiveness of the initial molecules fragmentation in plasma. Thus, the range of the bias potential should be defined for the specific reactor and synthesis conditions used to fabricate the materials of the invention, and the above indicated ranges of the bias potential are for purposes of illustration only, and not limitation.

Figure 7A:
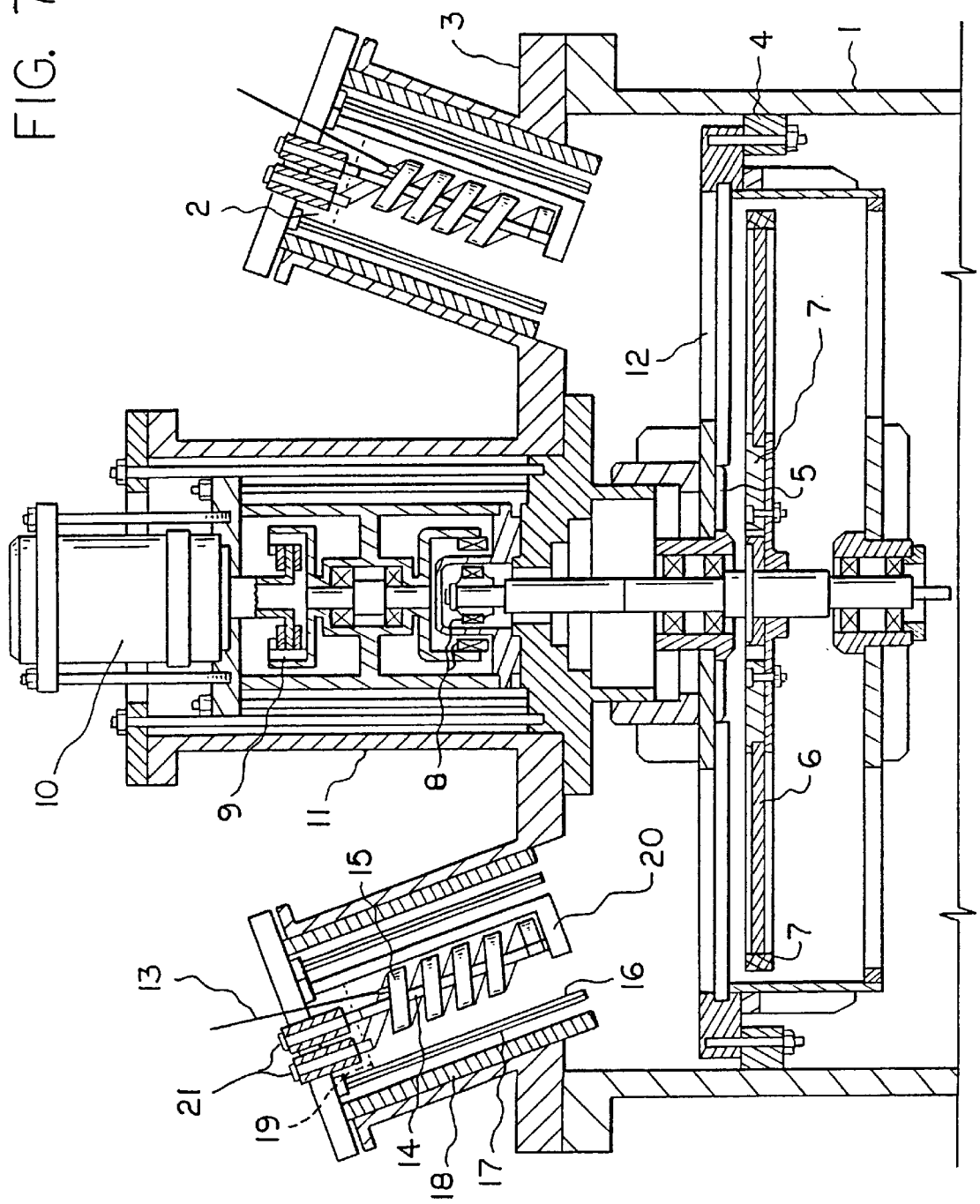
FIGS. 7A and 7B comprise a schematic showing a new and improved vacuum plasma apparatus used to produce an embodiment of the carbon material of the invention.
Figure 7B:
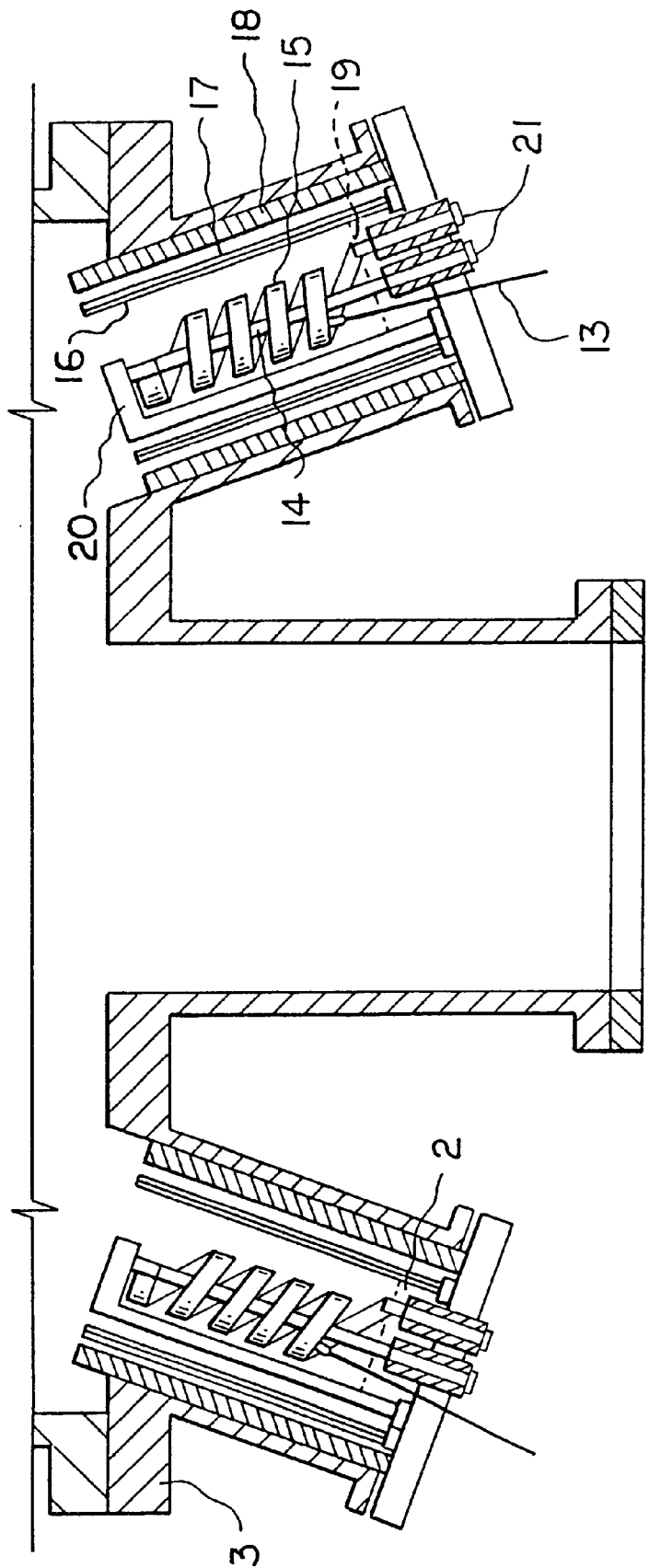

One embodiment of the process of the invention is shown at FIGS. 7A and 7B. A vacuum chamber, generally shown at 1 comprises conventional diffusion and mechanical pumps (not shown), the arrow indicating the pumping outlet of the chamber. The initial vacuum of chamber 1 is in the range of from about $3 \times 10^{-4}$ to about $3 \times 10^{-3}$ Pa. While the pressure in the area of material deposition is not critical for synthesis. That is, it is possible to deposit the material under standard (about 1 atmosphere) pressure conditions. However, sophisticated and expensive equipment is be necessary to provide high energy particles under such conditions. Likewise, high vacuum conditions (i.e.,. $10^{-3}$ to about $10^{-5}$ Pa) are more feasible, but under such conditions the growth rate is limited, the productivity is relatively low and material cost high. Preferably, the pressure of the plasma discharge is in the range of from about $5 \times 10^{-2}$ Pa to about 10 Pa and, more preferably in the range of from about $2 \times 10^{-1}$ to about 2.0 Pa. Although the pressure in the area of material deposition should not exceed the pressure in the area of plasma discharge, it is not limited with any lower value, and depends on the technical design of the vacuum system, particularly in the case of a differential pumping system. Most preferably, the pressure in the chamber during the deposition process is in the range of from about $1 \times 10^{-2}$ to about 1.0 Pa..

Existing plasma chambers comprise turbo-molecular pumps for fast starting the process. The turbo-molecular pumps can facilitate synthesis of the hierarchical Quasam based structures of the invention comprising hard-melting transition metals like Ti, Zr, etc., which metals are sensitive to the vacuum environment during sputtering. Although the turbo-molecular pumps facilitate synthesis of a wide range of Quasam structures, the turbo-molecular pumps are only optional for Quasam synthesis.

With reference to FIGS. 7A and 7B, the key features of the system include plasmatrons 2 having been installed on major flange 3, while super, high speed rotating substrate holders 4–12 essentially improve the technology performance, productivity and available properties range of Quasam materials. The super high-speed inlet for the substrate holders (4–12) is insulated from the chamber 1 and has an independent bias potential. The super high-speed inlet consists of the electrically insulated rotating holder 7, carrying substrates 6, stator 4, 5 and 12, vacuum-tight magnetic clutch 8, mechanical clutch 9, and electrical motor 10. Both the magnetic clutch 8 and mechanical clutch 9, as well as motor 10 are installed in a special section 11. The holder rotation speed may be varied from 0 to 1500 rotations/minute. The holder bias potential can be varied in the range of from about 0 to about −1000 V DC or r.f.

The plasmatrons are fully insulated from the chamber, and the potentials of the hot filament cathodes are independent from the chamber ground potential and substrate holder bias potential. Therefore, an effective accelerating potential between each individual plasma source on one hand, and the substrates holder and substrates on other hand, can be different for each individual plasmatron during one deposition process. While rotating, each substrate passes in turn each plasmatron wherein different accelerating voltage is applied, and correspondingly different particles of energy is realized. The preferred conditions of the graphite-like layers and diamond-like framework can be realized in turn upon each substrate during the substrates rotation.

For example, low energy plasmatrons with an effective accelerating voltage of from about 20 to about 100 V, and high energy plasmatrons with an effective accelerating voltage selected from the range of from about 200 to about 1000 V are alternated such that the total number N of plasmatrons installed in each side of the reactor is even. The rotation speed w ($s^{-1}$) corresponds to the synthesis of integer number (n) of monolayers of the depositing material during the slew of the substrate holder on the angle corresponding to one couple of plasmatron. Integer number (n) is preferably less than 10. The preferred rotation speed is w≈2V/Nn, $s^{-1}$.

Where V=15 µm/h, N=2, n=1, the rotation speed w=900 revolution/minute. In the more intensive deposition process, wherein V=25 µm/h, N=2, n=1, and the optimum rotation speed w=1500 revolution/minute, which corresponds to the maximum value available in the existing equipment. Alternatively, a low rotation speed can be used. For example, V=10 µm/h, N=6, n=10 and w=20 revolution/minute. Such control of the rotation speed and the plasma beams energetic parameters makes it possible to grow the material hierarchical structures during one continuous process in the same chamber. Also, side installation of the plasmatron is an optional feature of the invention, however such a design doubles system productivity and compensates the growing structures intrinsic stress while minimizing strain.

Any plasmatron providing a well focused plasma beam and effective conversion of the precursors vapors in the low molecular ions and radical can be used to synthesize the material of the invention. Such plasmatron designs are illustrated for purposes of example only and, not limitation, in FIGS. 7A and 7B. As shown in the figures, plasmatron 2 comprises a precursor vapor injector 13, hot filament 14 and hot high current electrical magnetic coil 15. Hot filament 2 and hot high current electrical magnetic coil 15 are the series elements of the same high current line. Internal screens 16 and 19 are manufactured from tungsten or W-Mo alloy. External screen 17 is manufactured from a high-temperature ceramic. Water cooling screen 18 and filament holder 20 are manufactured from tungsten or molybdenum. Insulated inlets are shown at 21. The typical filament current is in the range of from about 60 to about 100 A. The filament potential relative to screens 17, 18 is in the range of from about 100 to about 160 V, while the screens potential relatively to the ground potential (e.g. the chamber body potential) is in the range of from about 0 to about 1500 V and preferably, in the range of from about 0 to about 500 V. The substrate holder can be biased with DC potential in the range of from about 50 to about 200 relative to the ground potential, or with an equal r.f potential in the frequency range of from about 100 KHz to about 13.56 Mhz.

Although many different precursors and methods of their supply to the plasma discharge can be used for material synthesis, selection of optimal precursors provides lower cost production and high material effectiveness. Gaseous, liquid or solid precursors, including separate precursors for carbon and each of the alloying elements are contemplated by the invention. Different methods of precursor introduction into the plasma include a simple inlet of the gaseous precursors, an inject of the liquid precursor, evaporation of the liquid or solid precursors and/or sputtering of the solid precursors. The preferred alloying elements for stabilization include silicon and oxygen. Examples of such elements include silicon-organic compounds, particularly siloxanes. Examples of siloxanes within the scope of the invention, without limitation, include: cycloheptasiloxane $C_{14}H_{42}O_7Si_7$ (molecular weight M 519; melting point $T_m$-26° C.; boiling point $T_b$=154° C.), cyclotrisiloxane $C_9H_{24}O_3Si_3$ (M=265; $T_m$-3; $T_b$=199), cycloheptasiloxanes $C_{14}H_{42}O_7Si_7$ (M 519; $T_m$-26; $T_b$154), cyclotetrasiloxanes $C_9H_{24}O_4Si_4$ (M 308; $T_m$<0, $T_b$=84), $C_4H_{16}O_4Si_4$ (M=240,5; $T_m$=-65; $T_b$=134.5), $C_7H_{22}O_4Si_4$ (M 283; $T_m$-27; $T_b$165), $C_8H_{24}O_4Si_4$ (M 297; $T_m$17,5; $T_b$175), $C_{28}H_{32}O_4Si_4$ (M=545; $T_m$=-99; $T_b$=237), $C_{12}H_{24}O_4Si_4$ (M=345; $T_m$=-43.5; $T_b$=224), $C_{12}H_{32}O_4Si_4$ (M=353; $T_m$=-43.5; $T_b$=245), phenilmethylsiloxane $C_{27}H_{42}O_4Si_5$ (M=571; $T_m$<0; $T_b$=297). Any of the above elements can be introduced as vapors directly into the plasma generation zone of the reactor from an external source, while cyclotrisiloxanes and cyclotetrasiloxanes $C_6H_{18}O_3Si_3$ (M=222; $T_m$=64.5; $T_b$=134), $C_{24}H_{30}O_3Si_3$ (M=451; $T_b$=166), $C_{21}H_{24}O_3Si_3$ (M=409; $T_m$=100; $T_b$=190), $C_{32}H_{40}O_4Si_4$ (M=601; $T_m$=106; $T_b$=212) $C_{20}H_{48}O_4Si_4$ (M=465; $T_b$=291), $C_{48}H_{40}O_4Si_4$ (N 793; $T_m$=200; $T_b$=330) have to be evaporated into the reactor directly in the area of plasma generation. Cyclotetrasiloxanes $C_{28}H_{32}O_4Si_4$ (M=545; $T_m$=-99; $T_b$=237), $C_{48}H_{40}O_4Si_4$ (M 793; $T_m$=200; $T_b$=330), and $C_{32}H_{40}O_4Si_4$ (M=601; $T_m$=106; $T_b$=212) are characterized by having a high ratio of C:H, wherein $C_{48}H_{40}O_4Si_4$ (M 793; $T_m$=200; $T_b$=330) comprises the highest value of C:H>1.

The preferred precursors for Quasam synthesis the silicon-organic compounds of trisiloxanes and tetrasiloxanes groups, particularly cyclotetrasiloxane $C_{28}H_{32}O_4Si_4$ (M=545; $T_m$=-99; $T_b$=237) and phenilmethylsiloxane $C_{27}H_{42}O_4Si_5$ (M=571; $T_{m<0}$; $T_b$=297).

To date, the material of the invention has been synthesized to about 0.1 to 1.0 mm in thickness. In addition, 2 cm thick structures comprising about hundred layers of Quasam have been manufactured. The maximum area of deposition manufactured to date is about 7,000 $cm^2$ per camera having a mass productivity of about 5 to about 10 $cm^3$/day/camera, although it is important to note that a limit does not exist and processes are under way to produce material having even greater thickness.

The material of the invention exhibits very high mechanical properties (hardness, fatigue, specific modules, fracture toughness, fracture threshold, tribological characteristics, etc.), variable electrical properties, thermal stability, corrosion resistance, wear resistance, low specific weight, an excellent biocompatibility, high adhesion to virtually any substrate, and can be deposited upon metals, ceramics, composites, glasses and plastics including Teflon. The material of the invention can be used as protective coatings for various applications, as a structural material for the precise mechanic and, particularly, for micromechanical devices, as micro electrical-mechanical systems (MEMS), and also as a high heat conductive insulated substrate. Material containing metallic alloying elements can be used as a heat and electrical conductive substrate. The materials of the invention can be used as constructive materials for aerospace and automotives, and have orthopedic application.

The following Examples are provided to further illustrate the synthesis, properties, and applications of the carbon materials (Quasam) of the present invention. While metallic alloying metals are not illustrated in the Examples, the following metals have been successfully used to manufacture electrically conductive Quasam and hierarchical multilayer composite materials of the invention: Be, Se, Ti, Zr, Al, Nb, Ta, Cr, W, Fe, Co, N and Re. Also, the following metals from the second group of alloying elements were particularly preferred to grow the Quasam material of the invention: Be in the range of from about 6 to about 15 atomic %; Al in the range of from about 5 to about 20 atomic %; Ti, Zr, Hf, Nb, Ta and Re in the range of from about 5 to about 40 atomic % weight each element; Cr, Mo and W in the range of from about 5 to about 50 atomic % each element; Fe, Co and Ni in the range of from about 5 to about 50 atomic % each element; Cr, Fe, Ni anc Co alloys in the range of from about 10 to about 55 atomic % in total; and W, Cr and Ti embodied layers in the range of from about 10 nm to about 1000 nm.

EXAMPLE 1

The material of the invention was deposited under the following process conditions:

| | |
|---|---|
| Maximum particles energy | 90 eV |
| Accelerated field | r.f., 1.75 Mhz |
| Cathode current | 66 A |
| Number of plasmatrons | 1 |
| Precursor | phenilmethylsiloxane $C_{27}H_{42}O_4Si_5$ (M = 571; $T_m$ < 0; $T_b$ = 297) |
| Distance "filament-substrate" | 8 cm |
| Substrate temperature | 300° C. |
| Precursor flow rate | 7 $cm^3$ $hour^{-1}$ |
| Hard graphite-like material growth rate | 8 $\mu m$ $hour^{-1}$ |
| Effective deposition area (diameter) | 40 cm |
| Process time | 0.5 hour |
| The material was grown as follows: | |
| Thickness | 4 $\mu m$ |
| Specific density | 1.45 $g.cm^{-3}$ |
| Hardness | 18 GPa |
| Elastic modules | 140 Gpa |
| Roughness, Ra | <0.02 $\mu m$ |
| Thermal expansion | 1.6 × $10^{-7}$ $K^{-1}$ |
| Thermal diffusity | 0.75 $cm^2$ $s^{-1}$ |
| Electrical resistivity | $10^{12}$ Ohm.cm |

One application of the material shown in Example 1 is for use as insulating coatings (e.g. steel membrane for automotive sensors). The active sensor structure (thin film strain transducer) can be formed upon the carbon material of Example 1. Such a sensor structure is believed to exhibit the following characteristics: excellent adhesion both between the steel membrane and hard carbon, as well as between the steel membrane and active sensor structure; atomically smooth surface; flexibility and high fatigue.

EXAMPLE 2

The material of the invention was deposited under the following process conditions:

| | |
|---|---|
| Maximum particles energy | 90 eV |
| Accelerated field | DC |
| Cathode current | 65 A |
| Number of plasmatrons | 1 |
| Precursor | phenilmethylsiloxane $C_{27}H_{42}P_4Si_5$ (M = 571; $T_m$ < 0; $T_b$ = 297) |
| Distance "filament-substrate" | 6 cm |
| Substrate temperature | 385° C. |
| Precursor flow rate | 7 $cm^3$ $hour^{-1}$ |
| Hard graphite-like material growth rate | 10 $\mu m$ $hour^{-1}$ |
| Effective deposition area (diameter) | 30 cm |
| Process time | 0.5 hour |
| The material was grown as follows: | |
| Thickness | 5 $\mu m$ |
| Specific density | 1.96 $g.cm^{-3}$ |
| Hardness | 38 GPa |
| Elastic modules | 512 Gpa |
| Roughness, Ra | 0.02 $\mu m$ |
| Thermal expansion | 1.6 × $10^{-7}$ $K^{-1}$ |
| Thermal diffusity | 0.75 $cm^2$ $s^{-1}$ |
| Electrical resistivity | 5 × $10^{12}$ Ohm.cm |

The material of Example 2 exhibits high strength and elastic modules. Areas of applications of material fabricated in accordance with Example 2 include hard protective coatings, in particular, protective coating for steel tools.

EXAMPLE 3

The material was deposited under similar conditions to Example 1, except the energy of the particles was lower, while the substrate temperature higher. Also, the distance between the plasmatron and substrate was less, and the growth rate was correspondingly higher in contrast to Example 1. The material was deposited under the following process conditions:

| | |
|---|---|
| Maximum particles energy | 75 eV |
| Accelerated field | r.f., 1.75 MHZ |
| Cathode current | 70 A |
| Number of plasmatrons | 1 |
| Precursor | phenilmethylsiloxane $C_{27}H_{42}O_4Si_5$ (M = 571; $T_m$ < 0; $T_b$ = 297) |
| Distance "filament-substrate" | 5.5 cm |
| Substrate temperature | 470° C. |
| Precursor flow rate | 8 $cm^3$ $hour^{-1}$ |
| Hard graphite-like material growth rate | 14 $\mu m$ $hour^{-1}$ |
| Effective deposition area (diameter) | 25 cm |
| Process time | 0.25 hour |
| The material was grown as follows: | |
| Thickness | 3.5 $\mu m$ |
| Specific density | 1.56 $g.cm^{-3}$ |
| Hardness | 25 GPa |
| Elastic modules | 160 Gpa |
| Roughness, Ra | 0.0025 $\mu m$ |
| Thermal expansion | 1.6 × $10^{-7}$ $K^{-1}$ |
| Thermal diffusity | 0.8 $cm^2$ $s^{-1}$ |
| Electrical resistivity | $10^9$ Ohm.cm |

This material can be used for protective coating for cutting tools, in particular, protective coating for high-speed steel cutting tools. Mills with different diameters and shape manufactured in different countries (U.S.A., Japan, Israel) were coated with material from Example 3 and tested under standard conditions of steel cutting. The tests (data not shown) showed a 62 to 65% increase of mill life when coated with the material of the invention.

EXAMPLE 4

The material was deposited under similar conditions to Example 1, except that: the particle energy was 50 eV, the substrate temperature was 530° C., the distance between the plasmatron and substrate was 4 cm, the growth rate was 20

μm hours and the process time was 15 hours. The material was deposited under the following process conditions:

| | |
|---|---|
| Maximum particles energy | 50 eV |
| Accelerated field | r.f., 1.75 MHZ |
| Cathode current | 65 A |
| Number of plasmatrons | 1 |
| Precursor | phenilmethylsiloxane |
| Distance "filament-substrate" | 4 cm |
| Substrate temperature | 530° C. |
| Precursor flow rate | 8 cm$^3$ hour$^{-1}$ |
| Hard graphite-like material growth rate | 20 μm hour$^{-1}$ |
| Effective deposition area (diameter) | 20 cm |
| Process time | 15 hour |
| The material was grown as follows: | |
| Thickness | 300 μm |
| Specific density | 1.5 g.cm$^{-3}$ |
| Hardness | 28 GPa |
| Elastic modules | 180 Gpa |
| Roughness, Ra | 2.1 μm |
| Thermal expansion | $1.7 \times 10^{-7}$ K$^{-1}$ |
| Thermal diffusity | 0.8 cm$^2$ s$^{-1}$ |
| Electrical resistivity | $8 \times 10^8$ Ohm.cm |

The silicon substrate was scratched from back to side using a diamond tip. The 2×2 cm$^2$ pieces were then fabricated. Thereafter, the substrates were etched out from the pieces and free-standing material was bonded with a high-temperature compound having a composition similar to the deposited materials composition. 2×2×2 cm$^3$ bulk material was obtained having a total thickness of 63 compound interlayers (about 800 em). This material can be used for protective coatings, as well as heat-conductive insulated substrates for electronic devices. The material can also be used as a basic constructive material for micro-mechanics and micro electrical mechanical devices.

EXAMPLE 5

The material was deposited under similar conditions to Example 4, except that the growth conditions were under higher temperature. The material was deposited under the following process conditions:

| | |
|---|---|
| Maximum particles energy | 50 eV |
| Accelerated field | r.f., 1.75 MHZ |
| Cathode current | 65 A |
| Number of plasmatrons | 1 |
| Precursor | phenilmethylsiloxane $C_{27}H_{42}P_4Si_5$ (M = 571; $T_m$ < 0; $T_b$ = 297) |
| Distance "filament-substrate" | 2 cm |
| Substrate temperature | 955° C. |
| Precursor flow rate | 7 cm$^3$ hour$^{-1}$ |
| Hard graphite-like material growth rate | 17 μm hour$^{-1}$ |
| Effective deposition area (diameter) | 10 cm |
| Process time | 2 hour |
| The material was grown as follows: | |
| Thickness | 34 μm |
| Specific density | 1.6 g.cm$^{-3}$ |
| Hardness | 31 GPa |
| Elastic modules | 220 Gpa |
| Roughness, Ra | 0.7 μm |
| Thermal expansion | $1.7 \times 10^{-7}$ K$^{-1}$ |
| Thermal diffusity | 0.7 cm$^2$ s$^{-1}$ |
| Electrical resistivity | $5 \times 10^8$ Ohm.cm |

The general characteristics of this material are similar to the material grown in Example 4, although this material exhibits somewhat lower electrical resistivity and higher thermal stability.

EXAMPLE 6

The material was grown at a high temperature with different types of accelerating fields. The material was deposited under the following process conditions:

| | |
|---|---|
| Maximum particles energy | 50 eV |
| Accelerated field | r.f., 1.75 MHZ |
| Cathode current | 65 A |
| Number of plasmatrons | 1 |
| Precursor | phenilmethylsiloxane $C_{27}H_{42}O_4Si_5$ |
| Distance "filament-substrate" | 3 cm |
| Substrate temperature | 685° C. |
| Precursor flow rate | 7 cm$^3$ hour$^{-1}$ |
| Hard graphite-like material growth rate | 15 μm hour$^{-1}$ |
| Effective deposition area (diameter) | 15 cm |
| Process time | 6 hour |
| The material was grown as follows: | |
| Thickness | 90 μm |
| Specific density | 1.55 g.cm$^{-3}$ |
| Hardness | 32 GPa |
| Elastic modules | 260 Gpa |
| Roughness, Ra | 0.3 μm |
| Thermal expansion | $1.7 \times 10^{-7}$ K$^{-1}$ |
| Thermal diffusity | 0.8 cm$^2$ s$^{-1}$ |
| Electrical resistivity | $10^8$ Ohm.cm |

The general characteristics of this material are high thermal stability. In an oxygen-free environment, material grown in accordance to Example 6 can be used for periods of time at temperatures of at least 685° C.

EXAMPLE 7

The material was grown at conditions similar to Example 6 except at a different accelerating field. The material was deposited under the following process conditions:

| | |
|---|---|
| Maximum particles energy | 100 eV |
| Accelerated field | DC |
| Cathode current | 70 A |
| Number of plasmatrons | 1 |
| Precursor | phenilmethylsiloxane $C_{27}H_{42}P_4Si_5$ (M = 571; $T_m$ < 0; $T_b$ = 297) |
| Distance "filament-substrate" | 2 cm |
| Substrate temperature | 1095° C. |
| Precursor flow rate | 8 cm$^3$ hour$^{-1}$ |
| Hard graphite-like material growth rate | 12 μm hour$^{-1}$ |
| Effective deposition area (diameter) | 10 cm |
| Process time | 1.0 hour |
| The material was grown as follows: | |
| Thickness | 12 μm |
| Specific density | 1.96 g.cm$^{-3}$ |
| Hardness | 30 GPa |
| Elastic modules | 220 Gpa |
| Roughness, Ra | 0.04 μm |
| Thermal expansion | $1.7 \times 10^{-7}$ K$^{-1}$ |
| Thermal diffusity | 0.8 cm$^2$ s$^{-1}$ |
| Electrical resistivity | $5 \times 10^7$ Ohm.cm |

This material exhibits even higher thermal stability than the material grown in Example 6, and can be used under sever (extremely high) temperature conditions, such as, for example, a sensor membrane for such conditions.

EXAMPLE 8

The material was deposited under the following process conditions:

| | |
|---|---|
| Maximum particles energy | −100 eV |
| Cathode current | 65 A |
| Number of plasmatrons | 2 |
| Precursor | phenilmethylsiloxane $C_{27}H_{42}P_4Si_5$ (M = 571; $T_m$ < 0; $T_b$ = 297) |
| Distance "filament-substrate" | 6 cm |
| Substrate temperature | 385° C. |
| Precursor flow rate | 2 × 8 cm$^3$ hour$^{-1}$ |
| Hard graphite-like material growth rate | 20 μm hour$^{-1}$ |
| Effective deposition area (diameter) | 30 cm |
| Process time | 20 hour |
| The material was grown as follows: | |
| Thickness | 400 μm |
| Specific density | 1.56 g.cm$^{-3}$ |
| Hardness | 28 GPa |
| Elastic modules | 195 Gpa |
| Roughness, Ra | 3 μm |
| Thermal expansion | 1.6 × 10$^{-7}$ K$^{-1}$ |
| Thermal diffusity | 8.5 cm$^2$ s$^{-1}$ |
| Electrical resistivity | 5 × 10$^7$ Ohm.cm |

This material was deposited into a reactor as illustrated in FIG. 7A and 7B.

EXAMPLE 9

The material was deposited under the following process conditions:

| | |
|---|---|
| Low energy | 50 eV, r.f., 1.75 MHz |
| High accelerated voltage | 250 eV, DC |
| Cathode current | 65 A |
| Number of plasmatrons | 6 |
| Precursor | phenilmethylsiloxane $C_{27}H_{42}P_4Si_5$ (M = 571; $T_m$ < 0; $T_b$ = 297) |
| Distance "filament-substrate" | 6 cm |
| Substrate temperature | 400° C. |
| Precursor flow rate | 8 cm$^3$ hour$^{-1}$ |
| Hard graphite-like material growth rate | 15 μm hour$^{-1}$ |
| Effective deposition area (diameter) | 80 cm |
| Rotation | 300 min$^{-1}$ |
| Process time | 10 hour |
| The material was grown as follows: | |
| Thickness | 150 μm |
| Specific density | 1.57 g.cm$^{-3}$ |
| Hardness | 18 GPa |
| Elastic modules | 170 Gpa |
| Roughness, Ra | 1 μm |
| Thermal expansion | 1.7 × 10$^{-7}$ K$^{-1}$ |
| Thermal diffusity | 0.8 cm$^2$ s$^{-1}$ |
| Electrical resistivity | 5 × 10$^9$ Ohm.cm |

This material was deposited into a reactor as illustrated in FIG. 7A and 7B.

EXAMPLE 10

The material was deposited under the following process conditions:

| | |
|---|---|
| Maximum particles energy | 90 eV |
| Accelerated field | r.f., 1.75 MHz |
| Cathode current | 66 A |
| Number of plasmatrons | 1 |
| Precursor | phenilmethylsiloxane $C_{27}H_{42}P_4Si_5$ (M = 571; $T_m$ < 0; $T_b$ = 297) |
| Distance "filament-substrate" | 8 cm |
| Substrate temperature | 300° C. |
| Precursor flow rate | 7 cm$^3$ hour$^{-1}$ |
| Hard graphite-like material growth rate | 7 μm hour$^{-1}$ |
| Effective deposition area (diameter) | 40 cm |
| Process time | 1 hour |
| The material was grown as follows: | |
| Thickness | 7 μm |
| Specific density | 1.8 g.cm$^{-3}$ |
| Hardness | 15 GPa |
| Elastic modules | 120 Gpa |
| Roughness, Ra | <0.02 μm |
| Thermal expansion | 1.6 × 10$^{-7}$ K$^{-1}$ |
| Thermal diffusity | 0.75 cm$^2$ s$^{-1}$ |
| Electrical resistivity | 3 × 10$^{12}$ Ohm.cm |

This material was deposited into a reactor as illustrated in FIG. 7A and 7B.

From the foregoing, it will be obvious to those skilled in the art that various modifications in the above-described invention and Examples can be made without departing from the spirit and scope of the invention. Accordingly, the invention can be embodied in other specific forms without departing from the spirit or essential characteristics thereof, including the specific design of the plasmatron and process conditions. Present embodiments and Examples, therefore, are to be considered in all respects as illustrative and not restrictive, the scope of the invention being indicated by the appended claims rather than by the foregoing, and all changes which come within the meaning and range of equivalency of the claims are therefore intended to be embraced therein.

We claim:

1. A class of hard carbon materials comprising an sp$^2$ bonded graphite-like layer structure and an sp$^3$ bonded three-dimensional diamond-like framework, wherein said graphite-like layered structure is penetrated and bonded together by said diamond-like framework, wherein said materials comprise a density in the range of 1.3 to 1.7 g/cm$^3$.

2. A class of hard carbon materials according to claim 1, wherein the carbon content in said material comprises from about 40 to about 90 atomic % of the sum of carbon plus said first and said second alloying elements.

3. A class of hard carbon materials according to claim 1, wherein the graphite-like Sp carbon-carbon bonds in said material comprises from about 15 to about 90 atomic % of the sum of carbon-carbon bonds in said material.

4. A class of hard carbon materials according to claim 1, wherein the diamond-like sp$^3$ carbon-carbon bonds in said material comprises from about 15 to about 90 atomic % of the sum of carbon-carbon bonds.

5. A class of hard carbon materials according to claim 1, wherein the sum of concentration of said first and second alloying elements is from about 10 to about 60 atomic % of the sum of carbon plus said first and said second alloying elements.

6. A class of hard carbon materials according to claim 1, wherein said graphite-like Sp$^2$ carbon-carbon bonds comprises greater than 15 atomic % of the sum of carbon-carbon bonds, said diamond-like sp$^3$ carbon-carbon bond comprises greater than 15 atomic % of the sum of carbon-carbon bonds, and the sum of concentration of said first and second alloying elements comprises greater than 10 atomic % of the sum of carbon, said first and second alloying elements.

7. A class of hard carbon materials according to claim 1, wherein said graphite-like layers are mutually parallel with no azimuth order in-plane, and said diamond-like framework is fully amorphous.

8. A class of hard carbon materials according to claim 1, wherein the ratio between said graphite-like $sp^2$ bonds and said diamond-like $sp^3$ bonds can be modulated in a nanometer and/or micrometer scale such that a hierarchical structured material is formed.

9. A class hard carbon materials according to claim 8, wherein the ratio between said graphite-like $sp^2$ bonds and said diamond-like $sp^3$ bonds is modulated in the range of from about 10 nm to 100 $\mu$m.

10. A class of hard carbon materials according to claim 9, wherein the carbide, silicide or oxide bonds between the carbon and first and second alloying elements are modulated in a nanometer and/or micrometer scale.

11. A class of hard carbon materials according to claim 1, wherein said first and second alloying elements are embodied in the amorphous structure, such that the thickness of the layers formed by said elements is between about 1 nm to about 1,000 nm.

12. A class of hard carbon materials according to claim 1, wherein the nanocrystals or clusters of diamond, carbides, silicides, oxides or metals are embodied in the amorphous structure.

13. A method of fabricating a class of hard carbon materials, comprising:
  depositing a flow comprising constituent elements selected from the group consisting of ions, atoms, and radicals onto a substrate wherein at least 55 atomic % of carbon particles in said flow comprises an energy in the range of from about 20 to about 95 eV; and
  maintaining the temperature of said substrate during fabrication at about 300° C. to about 600° C.

14. A method of fabricating a class of hard carbon materials according to claim 13 wherein said flow comprises an energy in the range of from about 20 to about 75 eV and the temperature of said substrate during growth is at least 400° C.

15. A method of fabricating a class of hard carbon materials according to claim 14, wherein said flow comprises an energy in the range of from about 20 to about 50 eV, and the temperature of said substrate during growth is at least 500° C.

16. A class of materials according to claim 1, wherein said carbon material is stabilized with at least two alloying elements, said first alloying element comprising an element selected from the group consisting of O, N, and a combination thereof said second alloying element comprising an element selected from the group consisting of Si, B, Zr, Ti, V, Cr, Be, Mg, Ca, Hf, and a combination thereof, wherein said carbon materials comprising 40 to 85 atomic % of carbon from the sum of carbon and said alloying elements, the average content of graphite-like $sp^2$ carbon-carbon bonds is 15 to 85% of the sums of carbon bonds, the average content of diamond-like $sp^3$ carbon-carbon bonds is 15 to 85% of the sum of carbon-carbon bonds, and the sum of concentration of alloying elements is 15 to 60 atomic % of the sum of carbon and the alloying elements.

17. A class of materials according to claim 16, wherein said materials comprise hydrogen having a concentration no grater than 25 atomic % with respect to the total composition.

18. A method of fabricating a class of hard carbon materials, comprising:
  depositing a flow comprising constituent elements selected from the group consisting of ions and radicals; and
  alternating said flow between a high energy flow and a low energy flow wherein at least 55 atomic % of carbon particles in said low energy flow comprises an energy of less than 100 eV, at least 50 atomic % of carbon particles in said high energy flow comprises an energy above 200 eV, and the temperature of the substrate during growth is at least 300° C.

19. A method of fabricating a class of hard carbon materials according to claim 18, comprising:
  generating the constituent elements using at least two plasma generators selected from the group consisting of a low energy plasma generator, a high energy plasma generator and combinations thereof;
  electrically insulating the substrate holder and deposition chamber;
  directing the flow of particles from each of said plasma generators to a position on said substrate holder;
  rotating said substrate holder such that each substrate or part thereof passes alternately through said plasma generators.

20. A method of fabricating a class of hard carbon materials according to claim 19, comprising:
  monitoring the time frame during which each substrate or part thereof passes alternately through said plasma generators such that the time of the pass of each substrate is equal to or less than the deposition time of ten graphite-like monolayers.

21. A method of fabricating a class of hard carbon materials according to claim 20, comprising:
  actuating said substrate holder through a vacuum-tight magnetic clutch.

* * * * *